US00RE41249E

(19) United States
(12) Reissued Patent
Sato et al.

(10) Patent Number: US RE41,249 E
(45) **Date of Reissued Patent: *Apr. 20, 2010**

(54) QUARTZ GLASS BODY HAVING IMPROVED RESISTANCE AGAINST PLASMA CORROSION, AND METHOD FOR PRODUCTION THEREOF

(75) Inventors: Tatsuhiro Sato, Koriyama (JP); Nobumasa Yoshida, Koriyama (JP); Akira Fujinoki, Koriyama (JP); Kyoichi Inaki, Tokorozawa (JP); Tomoyuki Shirai, Shiga (JP)

(73) Assignees: Heraeus Quarzglas GmbH & Co. KG, Hanau (DE); Shin-Etsu Quartz Products Co., Ltd., Tokyo (JP)

( * ) Notice: This patent is subject to a terminal disclaimer.

(21) Appl. No.: 11/633,136

(22) Filed: Nov. 30, 2006

Related U.S. Patent Documents

Reissue of:
(64) Patent No.: 6,887,576
Issued: May 3, 2005
Appl. No.: 09/935,334
Filed: Aug. 22, 2001

(30) Foreign Application Priority Data

Aug. 23, 2000 (JP) ..... 2000-252993
Dec. 22, 2000 (JP) ..... 2000-390823
Dec. 26, 2000 (JP) ..... 2000-395988

(51) Int. Cl.
*B32B 15/00* (2006.01)

(52) U.S. Cl. ..... 428/426; 428/410; 428/432
(58) Field of Classification Search ..... None
See application file for complete search history.

(56) References Cited

U.S. PATENT DOCUMENTS 2,726,487 A * 12/1955 Cummins et al. ..... 264/660
3,806,570 A * 4/1974 Flamenbaum et al. ..... 264/1.21
3,850,602 A * 11/1974 Bruning ..... 65/17.4
3,859,073 A * 1/1975 Schultz ..... 65/60.51
3,894,164 A * 7/1975 Dismukes et al. ..... 427/70
4,047,966 A * 9/1977 Bihuniak et al. ..... 501/128
4,336,048 A * 6/1982 van der Steen et al. ..... 65/17.6
4,419,118 A * 12/1983 Reiji et al. ..... 65/17.4
5,532,195 A * 7/1996 Weiss et al. ..... 501/54
5,572,091 A * 11/1996 Langer et al. ..... 313/636
7,365,037 B2 4/2008 Sato et al.

FOREIGN PATENT DOCUMENTS

DE 199 18 001 A1 * 10/1999
EP 0 466 932 * 1/1992
JP 8-175840 * 7/1996

OTHER PUBLICATIONS

Patent Abstracts of Japan, vol. 1999, No. 13, Nov. 30, 1999, for JP 11–228172 A (Aug. 24, 1999).*
Patent Abstracts of Japan, vol. 2000, No. 9, Oct. 13, 2000, for JP 2000–169163 A (Jun. 20, 2000).*
Patent Abstracts of Japan, vol. 015, No. 256, Jun. 28, 1991, for JP 03–083833 A (Apr. 9, 1991).*
Patent Abstracts of Japan, vol. 012, No. 373, Oct. 6, 1988, for JP 63–123825 A (May 27, 1988).*
Patent Abstracts of Japan, vol. 012, No. 132, Apr. 22, 1988, for JP 62–252330 A (Nov. 4, 1987).*
Patent Abstracts of Japan, vol. 012, No. 479, Dec. 14, 1988, for JP 63–195133 A (Aug. 12, 1988).*
Patent Abstracts of Japan, vol. 013, No. 423, Sep. 20, 1989, for JP 01–160843 A (Jun. 23, 1989).*
Patent Abstracts of Japan, vol. 013, No. 236, May 30, 1989, for JP 01–045739 A (Feb. 20, 1989).*
Patent Abstracts of Japan, vol. 013, No. 221, May 23, 1989, for JP 01–033029 A (Feb. 2, 1989).*
Patent Abstracts of Japan, vol. 013, No. 199, May 11, 1989, for JP 01–018936 A (Jan. 23, 1989).*
Patent Abstracts of Japan, vol. 013, No. 145, Apr. 10, 1989, for JP 63–307139 A (Dec. 14, 1988).*
Patent Abstracts of Japan, vol. 013, No. 039, Jan. 27, 1989, for JP 63–236719 A (Oct. 3, 1988).*
Patent Abstracts of Japan, vol. 1996, No. 10, Oct. 31, 1996, for JP 08–165131 A (Jun. 25, 1996).*
Patent Abstracts of Japan, vol. 015, No. 467, Nov. 27, 1991, for JP 03–199133 A (Aug. 30, 1991).*
Patent Abstracts of Japan, vol. 009, No. 017, Jan. 24, 1985, for JP 59–164644 A (Sep. 17, 1984).*

* cited by examiner

*Primary Examiner*—Timothy M Speer
(74) *Attorney, Agent, or Firm*—Wenderoth, Lind & Ponack, L.L.P.

(57) ABSTRACT

An object of the present invention is to provide a quartz glass body, especially a quartz glass jig for plasma reaction in producing semiconductors having excellent resistance against plasma corrosion, particularly, excellent corrosion resistance against F-based gaseous plasma; and a method for producing the same. A body made of quartz glass containing a metallic element and having an improved resistance against plasma corrosion is provided that contains bubbles and crystalline phase at an amount expressed by projected area of less than 100 $mm^2$ per 100 $cm^3$.

27 Claims, No Drawings

QUARTZ GLASS BODY HAVING IMPROVED RESISTANCE AGAINST PLASMA CORROSION, AND METHOD FOR PRODUCTION THEREOF

Matter enclosed in heavy brackets [ ] appears in the original patent but forms no part of this reissue specification; matter printed in italics indicates the additions made by reissue.

TECHNICAL FIELD OF THE INVENTION

The present invention relates to a quartz glass body, and especially to a quartz jig for use in producing semiconductors yet having excellent resistance against plasma corrosion, and to a production method thereof.

RELATED ART

In the production of semiconductors, for instance, in the production of semiconductor wafers, with the recent trend in increasing the diameter, the process efficiency is improved by using a plasma reaction apparatus in the etching process and the like. For instance, in the process of etching semiconductor wafers, etching treatment is performed by using gaseous plasma; for example, a fluorine (F) based gaseous plasma.

However, if a conventionally used quartz glass is placed, for instance, in a F-based gaseous plasma, $SiO_2$ undergoes reaction with the F-based gaseous plasma on the surface of the quartz glass surface so as to generate $SiF_4$. Since the boiling point of the thus generated $SiF_4$ is −86° C., it easily volatilizes so as to cause great corrosion on the surface of the quartz glass. Thus, quartz glass was found to be unsuitable for use as jigs exposed to a F-based gaseous plasma because thinning and surface roughening proceed on the surface of the quartz glass.

As described above, severe problems were found to develop on conventional quartz glass in manufacturing semiconductors employing plasma reaction with regard to resistance against plasma corrosion, particularly, in case of applying etching treatment using a F-based gaseous plasma. In the light of such circumstances, it has been proposed that the surface of the quartz glass member be covered with aluminum or an aluminum compound to improve the resistance against plasma corrosion of the quartz glass member (see JP-A-Hei9-957751, JP-A-Hei9-95772, and JP-A-Hei10-139480 (the term "JP-A" as referred herein signifies "an unexamined published Japanese patent application")), or to incorporate aluminum in quartz glass to improve resistance against plasma corrosion (JP-A-Hei11-228172).

PROBLEMS THE INVENTION IS TO SOLVE

The present inventors have made extensive studies to further increase the resistance against plasma corrosion of quartz glass, and among them, an investigation of the resistance against plasma corrosion has been made for a quartz glass prepared by heating and fusing, in vacuum, a quartz glass powder having mixed therein 5% by weight of alumina powder. On investigating the resistance against plasma corrosion of the thus produced quartz glass, it has been found that the etching rate thereof was lowered by 40 to 50% as compared with that of a quartz glass member free from doping.

However, fine bubbles have been observed to develop inside and on the surface portion of the quartz glass body.

Particularly on the surface portion, it has been found that a great difference occurred between the corroded portion and the non-corroded portion so as to increase surface roughness. Furthermore, fine crystalline portions were found to develop so as to frequently cause the problem of peeling off on those portions. This resulted in the generation of fine indentations (dimples) and in the increased generation of particles that adhere to the surface of the wafer, thereby leading to problems such as an increase in defective wafers. In addition to the above, since such bubbles and indentations accelerate etching, even though the concentration of the metal dopant is increased, the resistance against plasma corrosion has been found to result in a relatively poor improvement.

One of the reasons for this effect may be that the boiling point of $AlF_3$, which is generated on the reaction with the F-based plasma gas, is 1290° C., a temperature far higher than that of $SiF_4$. Hence, presumably, while a large amount of the $SiF_4$ portion is corroded, little evaporation occurs on the surface of the $AlF_3$ portion, and this leads to a great difference in the etched quantity. Furthermore, if doped aluminum is locally concentrated, a clear difference in energy state occurs as compared with the neighboring $SiO_2$ portions, and this causes a loss in balance so as to easily cause a transition of $SiO_2$ to a crystalline state having lower energy.

The crystalline phase can be visually observed as fine white foreign matter. Since the crystalline portions that are formed in the vicinity of the surface have a thermal expansion differing from that of quartz glass, they tend to easily peel off with the change in temperature. Furthermore, since the metallic elements that are locally concentrated have lower boiling points than that of $SiO_2$, they convert into gaseous phase on heating and fusing $SiO_2$ as to generate bubbles. The bubbles that are present in the vicinity of the surface easily burst with a change in temperature. The facts described above all lead to a cause of generating particles. Furthermore, since plasma gas concentrates on the bubbles and the indented portions to easily increase the etching rate, the total amount of etching of the entire glass increases so as to shorten the usable life of the glass.

The present invention has been completed based on the above findings, and an object of the present invention is to provide a quartz glass as a material for jigs to use in the plasma reaction during the manufacture of semiconductors, but having excellent corrosion resistance against plasma, particularly, F-based gaseous plasma. Another object of the present invention is to provide a quartz glass jig, and a further object of the present invention is to provide methods for producing the above.

MEANS FOR SOLVING THE PROBLEMS

In order to accomplish the aforementioned objects, the present invention provides a quartz glass body having improved resistance against plasma corrosion, provided that the quartz glass contains bubbles and crystalline phase (foreign matters) at an amount expressed by projected area of less than 100 $mm^2$ per 100 $cm^3$.

As an embodiment for incorporating the metallic element above, as a matter of course, not only doping and/or surface coating is included, but also, so long as the metallic element is incorporated at a predetermined concentration, any mode of incorporation can be employed.

If the content of the bubbles and the crystalline phase of quartz glass is set to an amount expressed by projected area of less than 100 $mm^2$ per 100 $cm^3$, this level provides a quartz glass member for general use, and no particles develop in the plasma etching step. However, if the content of the bubbles and the crystalline phase is not less than the range above, a large quantity of particles generates in the plasma etching step.

The metal element to be incorporated in the quartz glass is not limited to Al (aluminum) or aluminum compounds that are disclosed in the aforementioned proposals, but other metallic elements are usable in F-based gaseous plasma etching so long as the fluoride of the metallic element yields a boiling point higher than that of the fluoride of Si ($SiF_4$).

As the metallic elements above, there can be used one type or two or more types of elements selected from the group consisting of Sm, Eu, Yb, Pm, Pr, Nd, Ce, Tb, Gd, Ba, Mg, Y, Tm, Dy, Ho, Er, Cd, Co, Cr, Cs, Zr, Al, In, Cu, Fe, Bi, Ga, and Ti. The boiling point or the gasification temperature of the fluorides of metallic elements other than those enumerated above are too low to cause further etching. Since the metallic elements above each provide a fluoride having a boiling point higher than that of Si, etching does not proceed as in the case of Si. The metallic elements are listed in the descending order of boiling point or gasification temperature; for instance, the boiling point of SmF is 2427° C., and gasification temperature of TiF is 284° C.

The boiling point or the gasification temperature of the fluorides of metallic elements other than those enumerated above are too low to cause further etching. The concentration of the metallic elements above is preferably in a range of from 0.1 to 20 wt. %. If the metallic element should be incorporated at a concentration of less than 0.1 wt. %, no improvement in the resistance against etching would be expected; if the metallic element should be incorporated at a concentration exceeding 20 wt. %, bubbles or crystalline phase would be generated in large quantities to make the glass unfeasible for use as jigs.

For instance, specially preferred usable elements are those such as Ti, Zr, and Y, and rare earth elements having a high resistance against etching corrosion, such as Sm. However, in case of a metallic element not favorable in the semiconductor industry, it should be used under the condition that the element imparts an extremely high corrosion resistance against etching of the quartz glass.

In case of employing mixing the metal oxide with quartz glass powder as a means for doping, melting is performed in a heating furnace or by Verneuil method; however, if the doped metal oxide yields a melting point of 2,500° C. or higher, it is difficult to sufficiently melt the powder of the metallic oxide so long as a production method of the present art is employed. In such a case, a powder aggregate or a crystalline bulk remains to yield visually observable minute white foreign matter. Accordingly, it is preferred to dope metal oxides having a melting point lower than 2,500° C.

Furthermore, not only can a single metallic element be employed, but it is also effective to co-dope with a plurality of metallic elements.

The concentration of the metallic elements above is preferably in a range of from 0.1 to 20% by weight, and more preferably, 1.0 to 15% by weight. As a result of the experiments performed by changing the concentration of the metallic elements, if the concentration of the metallic elements is less than 0.1% by weight, no improvement is observed on the resistance against etching corrosion. On the other hand, if the concentration should exceed 20% by weight, the amount of doping becomes too large to find any feasible means to suppress the generation of bubbles and crystalline phase.

The quartz glass body according to the present invention preferably has a metallic element-containing layer with a predetermined thickness containing 0.1 to 20% by weight of said metallic element. Preferably, the metallic element-containing layer is a surface layer having a thickness of at least 5 mm.

In incorporating the metallic elements in the metallic element-containing layer, the metallic element may be doped in the quartz glass during manufacturing, or, in a preferred embodiment of the invention, an additional surface coating may be employed to coat the surface of the quartz glass body.

The quartz glass body according to the present invention preferably shows a surface roughness Ra falling in a range of from 0.01 to 10 μm. Such a surface roughness can be obtained by subjecting the quartz glass body to a precision cutting treatment, a heating and melting treatment, or a frost treatment (=a heating and melting treatment followed by a chemical etching treatment, as explained below). By providing such a surface state, fine cracks on the surface can be removed after mechanical processing to suppress the generation of initial particles on applying plasma etching.

The precision cutting treatment comprises precision cutting the surface of the glass body by using a machine, and is advantageous in that less surface cracks are generated. The heating and melting treatment comprises performing surface heating and thereby fusion removing the surface cracks by means of gas combustion using oxyhydrogen, acetylene, etc., or by utilizing an electric heating source such as arc power.

The frost treatment (frosting) comprises subjecting a surface of the glass body to a heating and melting treatment, followed by immersing the resulting surface into a mixed solution of HF, acetic acid, ammonium fluoride, and pure water (which may be substituted by a solution containing 10 to 50 wt. % HF), thereby removing the surface layer by etching while simultaneously forming a uniform surface. The quartz glass bodies thus obtained by any of the processes above contain residual OH at a high concentration attributed to the production method.

The OH concentration of the quartz glass according is in a range of from 100 wtppm to 2,000 wtppm. If the OH concentration should be 100 ppm or higher, the effect of holding the alkali metals passing and diffusing through the quartz glass body becomes higher to prevent external contamination from occurring on the wafer. However, if the OH concentration should exceed 2,000 ppm, the viscosity becomes excessively low so as to disadvantageously cause undesirable deformation of the wafer.

The amount of gas generated in a temperature range of from room temperature to 1000° C. is 2 $mol/m^3$ or less. Since the quartz glass body obtained through the above process is produced in the high temperature region of 1000° C. or higher, the previously occluded gas that is discharged up to 1000° C. amounts to a total of 2 $mol/m^3$ or less. Since the etching process is carried out in the temperature range of several hundreds of degrees Celsius, the actual amount of evolved gas is less than the total. Such a trace quantity of generated gas does not affect the quality of the wafer when brought into contact with the wafer, nor influences the gaseous plasma.

Preferably, the quartz glass above has an internal transmittance for a visible radiation of 50%/cm or higher.

In a further (second) embodiment of the invention, the metallic elements are incorporated into the quartz glass of the body by surface coating, whereby a metallic element is applied to a surface thereof, characterized in that the resulting quartz glass contains bubbles and crystalline phase at a quantity accounting for less than 100 $mm^2$ in a projection area per 100 $cm^3$ of the quartz glass body.

The body thus obtained has a metallic element containing surface layer as explained above. The above explanations are also valid for this metallic element containing surface layer since the properties and the preferred modifications of the surface layer obtained by surface coating are the same as for the metallic element containing surface layer obtained by doping.

In a preferred embodiment, the quartz glass body is a jig for general use, especially a jig for supporting wafers. Under conditions of general use, the depth of corrosion occurring in contact with gaseous plasma is about 1 to 2 mm, or about 5 mm maximum. Accordingly, to improve the etching resistance of the quartz glass jig, the preferred condition for using the quartz glass having excellent resistance against plasma corrosion of the present invention is to set the thickness of the metallic element-containing layer containing the metallic elements above at a concentration in a range of from 0.1 to 20% by weight to at least 5 mm.

A first embodiment of producing the quartz glass having improved resistance against plasma corrosion according to the present invention comprises employing Verneuil process, i.e., a method for producing an ingot by using an oxyhydrogen flame, comprising providing a mixture of an $SiO_2$-powder and a metal containing substance containing an metallic element or a compound thereof, heating an fusing the mixture by dropping the heated and fused $SiO_2$-powder and the metal containing substance on a target area of said ingot while heating the target area of said quartz glass ingot to a temperature not lower than the melting temperature of the oxide of said metal.

Preferably said target area is heated to a temperature of 1800° C. or higher, and preferably, at a temperature not higher than 3000° C.

According to a first embodiment of the present invention, by employing Verneuil method as the production process, the metal containing substance is provided in form of a metal containing powder which contains the metallic element or a compound thereof. The metal containing powder is mixed with $SiO_2$-powder and the powder mixture is heated and melted onto the growing target surface of the ingot.

In case of doping the quartz glass with a metallic element or a compound thereof in the form of powder, heating and fusing must be carried out while applying sufficient heat energy in a manner such that the powder of the metallic element or the powder of the compound may be decomposed to the atomic or molecular level and be uniformly diffused and mixed with the quartz powder.

According to a second embodiment of the present invention by employing Verneuil method as the production process, the metal containing substance is provided in form of a metal containing solution prepared by dissolving a metallic element or a compound thereof in pure water, an acidic solution, an alkaline solution, or an organic solvent.

The metal containing substance is preferably applied into the quartz glass in the form of a gas or a liquid. However, in case it is mixed in the form of powder, the powder is preferably as finely divided as possible; in particular, since a metallic element tends to remain and concentrate in the $SiO_2$ network in the form of an oxide, preferably the melting point of the oxide is as low as possible.

In general, with respect to the most commonly employed method comprising fusing a mixture of a quartz powder and a powder of a metallic element to be doped in a heating furnace, there is a limit in the high temperature region.

Thus, it is extremely difficult to carry out a treatment at temperatures of 2000° C. or higher.

In case a Verneuil method is employed as the production process, the thermal energy that is supplied to a powder can be set high and at uniform density. Thus, a quartz glass body having less bubbles or crystalline phase can be implemented. So long as a metal oxide having a melting point up to about 2500° C. is used, fusion and diffusion of the metallic oxide can be realized by setting the surface temperature of the ingot being formed in the vicinity of the melting temperature or even higher.

As the powder, a quartz powder is used containing mixed therein the metallic powder, an oxide, a nitrate compound, a chloride, and other compounds. Concerning the mode of doping, it is extremely effective to use, in the place of a powder, a solution having uniformly dissolved therein a metallic element disintegrated to the atomic or molecular level, which is dropped in the form of a liquid onto the growing surface of the ingot being formed, or sprayed to the growing surface of the ingot in the form of a volatilized gas, or by using a carrier gas. As such a solution, there can be used a solution obtained by dissolving the metallic powder in an acidic or an alkaline solution, a solution obtained by dissolving a nitrate compound in pure water, a solution obtained by dissolving a chloride compound in ethanol, a solution of an organometallic compound, or a solution obtained by dissolving the organometallic compound in an organic solvent.

In accordance with a second embodiment of the present invention for producing quartz glass having excellent resistance against plasma corrosion, a method is provided comprising a preparation of a porous $SiO_2$ body and heat treating it in an atmosphere containing the metallic element at concentration in the range from 0.1 to 10 mol per 22.4 liter and applying a heat treatment thereto.

The second embodiment of the present invention, which comprises diffusing and doping a doping substance in the gaseous state inside the porous body, can be defined as a CVD process. The porous $SiO_2$ body is allowed to stand still and subjected to a heat treatment in an atmosphere containing the metallic element at a gas density of 0.1 mol/22.4 liter to 10 mol/22.4 liter. After the treatment is continued for a long time, until the gas is sufficiently diffused in the porous body, the temperature is lowered so that the metallic element may reside uniformly inside the porous body in the form of oxides without causing local concentration. Since an increase in gas density increases the concentration of the oxide residing in the porous body, it is more effective to set the heating temperature as low as possible while setting the pressure as high as possible. The heating temperature is preferably set to a temperature not lower than the boiling point, the gasification point, or the decomposition point of the metallic element or of the compound thereof, and the pressure is preferably set in a range of from 1 to 10 atomspheres.

In accordance with a third embodiment of the present invention for producing the quartz glass having excellent resistance against plasma corrosion, a method is provided which comprises preparing a slurry by dissolving in pure water, an acidic solution, an alkaline solution, or an organic solvent, a mixture of a quartz glass powder having a particle size distribution in a range of from 0.01 to 1,000 μm and containing from 1 to 50% by weight of particles with size ranging from 0.01 to 5 μm, with a metallic element or a compound thereof soluble in pure water, an acidic solution, an alkaline solution, or an organic solvent; drying and solidifying said slurry; and heating and fusing the solidified slurry in vacuum. This method is generally defined as a slip casting method.

In the method comprising dissolving a quartz powder in pure water, mixing it with an aqueous solution of a metallic element to prepare a slurry, and forming therefrom a transparent solid by drying and heating in vacuum, it is necessary, for the drying and solidification, that the quartz powder has a particle size distribution such that the particles 5 μm or less in size account for 1 to 50% by weight of the powder. The particles 5 μm or less in size can be obtained by finely dividing the same quartz powder, or by using fumed silica prepared by flame hydrolysis of silicon tetrachloride.

As an aqueous solution of the metallic element, there can be used that obtained by dissolving a metallic powder in an acidic or an alkaline solution, that obtained by dissolving a nitrate compound in pure water, that obtained by dissolving a chloride compound in an organic solvent such as ethanol, an organometallic compound or that obtained by dissolving it in an organic solvent. Particularly preferred is to use a solution obtained by dissolving a nitrate compound in pure water, because the resulting quartz glass body contains less bubbles.

The method for preparing a quartz glass jig having an improved resistance against plasma corrosion comprises coating the surface of a previously prepared quartz glass jig with a solution prepared by mixing and dissolving in pure water, an acidic solution, an alkaline solution, or an organic solvent, a metallic element or a compound thereof soluble in pure water, an acidic solution, an alkaline solution, or an organic solvent; followed by heating and fusing the thus coated surface.

In case there is particular interest in increasing the concentration of the metallic element on the surface of the quartz glass jig, it is effective to employ a method comprising coating the surface of the quartz glass jig with the solution containing the metallic element and then applying heating thereto for fusion. As the solution containing the metallic element, there can be used that prepared by dissolving a nitrate compound of the metallic element in pure water, obtained by dissolving a chloride compound of the metallic element in an organic solvent such as ethanol, an organometallic compound containing the metallic element or that obtained by dissolving it in an organic solvent. The solution thus obtained is then supplied dropwise, applied by using a brush, or sprayed onto the surface of the quartz glass jig. As the solution of the metallic element, particularly preferred is an organometallic compound containing the metallic element or a solution prepared by dissolving it in an organic solvent.

Then, the metallic element is fused on the surface and baked by means of flame melting, electric heating, arc melting, etc. In such a case, it is preferred to use a quartz glass jig previously doped with a metallic element, because the metallic element can be incorporated at a high concentration in the entire body. Furthermore, such a quartz glass jig exhibits affinity with the surface containing the metallic element at a high concentration to prevent cracks and the like from being formed during cooling.

As a previously prepared quartz glass jig, a known quartz glass jig can be used, but preferably used is a quartz glass jig produced in accordance with the methods of the present invention for producing a quartz glass having excellent resistance against plasma corrosion described hereinbefore.

As a means for measuring the local concentration of the metallic elements, EPMA (Electron Probe Micro Analysis) can be used to measure the planar distribution. Since the other portions are crystalline, X-ray diffraction or polarized optical microscope can be used for the detection.

EXAMPLES

The present invention is described in further detail below by way of examples, but it should be understood that these are provided only for exemplification, and are by no means limiting.

Example 1

A 1900-g portion of quartz particles were mixed with 100 g of $Al_2O_3$ powder, and the resulting mixture was dropped and fused in an oxyhydrogen flame at a rate of 50 g/min on a target ingot being rotated at a speed of 1 rpm to obtain a quartz glass ingot 200 mm in diameter and 50 mm in length. The gas condition was set to flow gaseous $H_2$ at a rate of 200 liter/min and gaseous $O_2$ at a rate of 100 liter/min. The target ingot was then set inside a vessel having a volume 300 mm×300 mm and 200 mm in height. If the gases were flowed at a rate lower than the conditions above, bubbles and crystalline phase were observed to generate, and if they were flowed at a rate higher than above, the shape of the ingot was no longer retained. The temperature of the growing plane of the ingot was found to be 2,200° C.

The ingot thus prepared was subjected to fluorescent X-ray analysis to obtain aluminum concentration. As a result, the average concentration in a region from the surface ranging to a depth of 0.1 mm was found to be 3.0% by weight, and the concentration at a position 5.0 mm in depth from the surface was found to be 2.0% by weight. Excluding the surface, the average concentration for the overall region of the thus formed ingot was found to be approximately 2.0% by weight. The outermost surface portion is believed to yield a high concentration due to progressive gasification of quartz.

Then, the content of bubbles and crystalline phase of thus formed ingot was measured, and the presence of crystalline phase of thus formed ingot was detected by means of X-ray diffraction. The results are given in Table 1. No crystalline phase was present, and the content of bubbles and crystalline phase was found to be 39 $mm^2$.

Furthermore, as described hereinafter, the amount of particle generation and the etching rate were measured, and the results are given in Table 1. The amount of generated particles was found to be low, and the etching rate was sufficiently low. Thus, it has been confirmed that the product has excellent resistance against plasma corrosion.

Example 2

Quartz particles were dropped and fused in an oxyhydrogen flame at a rate of 50 g/min on a target ingot being rotated at a speed of 1 rpm, and simultaneously, a 30% aqueous solution of aluminum nitrate was supplied dropwise to the growing surface of the ingot at a rate of 10 cc/min to obtain a quartz glass ingot 200 mm in diameter and 50 mm in length. The gas condition was set to flow gaseous $H_2$ at a rate of 150 liter/min and gaseous $O_2$ at a rate of 75 liter/min. The target ingot was then set inside a vessel having a volume 300 mm×300 mm×200 mm high.

On measuring the aluminum concentration of the thus prepared quartz glass ingot by means of fluorescent X-ray analysis, a concentration of 3.0 wt. % was obtained for the outermost surface portion (to a depth of 0.1 mm from the surface) and 1.0 wt. % for the portion at a depth of 5 mm from the surface. The outermost surface portion is believed to yield a high concentration due to progressive gasification of quartz. The average concentration over the entire length of the thus formed ingot was found to be approximately 1.5 wt. %. Furthermore, measurements were performed for items similar to those described in Example 1, and the thus obtained results are given in Table 1. From the results shown in Table 1, it has been confirmed that the product yields excellent resistance against plasma corrosion.

Example 3

A quartz glass ingot was prepared in the same manner as in Example 2, except for using zirconium oxynitrate as a doping material in the place of aluminum nitrate. The zirconium concentration was measured for the thus prepared quartz glass ingot, and measurements were performed for the items similar to those described in Example 1. The results are given in Table 1. It has been confirmed that the product yields excellent resistance against plasma corrosion.

Example 4

A quartz glass ingot was prepared in the same manner as in Example 2, except for using yttrium nitrate as a doping material in the place of aluminum nitrate. The yttrium concentration was measured for the thus prepared quartz glass ingot, and measurements were performed for the items similar to those described in Example 1. The results are given in Table 1. It has been confirmed that the product yields excellent resistance against plasma corrosion.

TABLE 1

| | Example No. | | | |
|---|---|---|---|---|
| | 1 | 2 | 3 | 4 |
| Production method | Verneuil | Verneuil | Verneuil | Verneuil |
| Metallic element compound | $Al_2O_3$5 wt. % | Pure water + aluminum nitrate | Pure water + zirconium oxynitrate | Pure water + yttrium nitrate |
| State of sample before etching test | | | | |
| Bubbles ($mm^2$) | 19 | 18 | 18 | 29 |
| Crystalline phase ($mm^2$) | 20 | 20 | 17 | 28 |
| XRD*[1] | None | None | None | None |
| Foreign matters | | | | |
| Concentration of metallic element (wt. %) | 2.0 | 1.5 | 1.9 | 1.8 |
| Particles generated (particles) | 11 | 13 | 11 | 9 |
| Etching rate (nm/min) | 35 | 35 | 33 | 40 |

*[1]Here in and the following tables 2-8 XRD means "X-ray diffraction"

Example 5

A quartz glass ingot was prepared in the same manner as in Example 2, except for using samarium nitrate as a doping material in the place of aluminum nitrate. The samarium concentration was measured for the thus prepared quartz glass ingot, and measurements were performed for the items similar to those described in Example 1. The results are given in Table 2. It has been confirmed from the results in Table 2 that the product yields excellent resistance against plasma corrosion.

Example 6

A quartz glass ingot was prepared in the same manner as in Example 2, except for using a solution prepared by dissolving 30 wt. % of aluminum chloride in ethanol for use as the doping material in the place of the 30 wt. % aqueous solution of aluminum nitrate. The aluminum concentration was measured for the thus prepared quartz glass ingot, and measurements were performed for the items similar to those described in Example 1. The results are given in Table 2. It has been confirmed from the results in Table 2 that the product yields excellent resistance against plasma corrosion.

Example 7

A quartz glass ingot was prepared in the same manner as in Example 2, except for using a solution prepared by dissolving 5 wt. % of aluminum in hydrochloric acid for the doping material in the place of the 30 wt. % aqueous solution of aluminum nitrate. The aluminum concentration was measured for the thus prepared quartz glass ingot, and measurements were performed for the items similar to those described in Example 1. The results are given in Table 2. It has been confirmed from the results in Table 2 that the product yields excellent resistance against plasma corrosion.

Example 8

A quartz glass ingot was prepared in the same manner as in Example 2, except for using a solution prepared by dissolving 30 wt. % of Al isopropoxide in propanol for the doping material in the place of the 30 wt. % aqueous solution of aluminum nitrate. The aluminum concentration was measured for the thus prepared quartz glass ingot, and measurements were performed for the items similar to those described in Example 1. The results are given in Table 2. It has been confirmed from the results in Table 2 that the product yields excellent resistance against plasma corrosion.

TABLE 2

| | Example No. | | | |
|---|---|---|---|---|
| | 5 | 6 | 7 | 8 |
| Production method | Verneuil | Verneuil | Verneuil | Verneuil |
| Metallic element compound | Pure water + samarium | Ethanol + $AlCl_3$ nitrate | Hydrochloric acid + | Propanol + Al iso-propoxide aluminum |
| State of sample before etching test | | | | |
| Bubbles ($mm^2$) | 17 | 20 | 15 | 20 |
| Crystalline phase ($mm^2$) | 29 | 23 | 29 | 28 |
| XRD*[1] | None | None | None | None |
| Foreign matters | | | | |
| Concentration of metallic element (wt. %) | 1.3 | 2.0 | 2.4 | 1.3 |
| Particles generated (particles) | 13 | 15 | 13 | 10 |
| Etching rate (rm/min) | 32 | 31 | 30 | 30 |

Example 9

A quartz glass ingot was prepared in the same manner as in Example 2, except for using a solution prepared by dissolving 30 wt. % of aluminum isopropoxide in ethyl silicate for the doping material in the place of the 30 wt. % aqueous solution of aluminum nitrate. The aluminum concentration was measured for the thus prepared quartz glass ingot, and measurements were performed for the items similar to those described in Example 1. The results are given in Table 3. It has been confirmed from the results in Table 3 that the product yields excellent resistance against plasma corrosion.

Example 10

A silica glass preform 500 mm in diameter and 1,000 mm in height prepared by soot method was set inside a quartz glass vessel 600 mm in diameter and 1,200 mm in height together with 500 g of aluminum chloride granules, and after replacing the atmosphere to gaseous $N_2$, the gas inlet line was stopped, and heating was initiated to elevate the temperature to 400° C., thereby gasifying all of aluminum chloride to obtain an atmosphere containing 100% aluminum chloride. The state was maintained for 10 hours under the atmospheric condition, at which time heating was stopped to lower the temperature to room temperature. The soot was taken out of the vessel, and was placed inside a vacuum furnace to elevate the temperature to 1,800° C. to obtain a transparent glass body.

From the surface portion of the thus obtained quartz glass, 3 wt. % of aluminum was detected, but for a portion at a depth of 5 mm from the surface, the aluminum concentration was found to be 2.0 wt. %. Thus formed quartz glass was found to have an average aluminum concentration of ca. 1.1 wt. %. Aluminum was detected in high concentration on the surface, presumably due to the residual alumina while $SiO_2$ underwent gasification during the vitrification of the soot into a transparent body.

The boiling point of aluminum chloride is 180° C., however, at a treatment temperature of 150° C. or lower, the gasification vapor pressure decreases to 70 mmHg or lower. The concentration of gaseous aluminum chloride in the atmosphere was found to be 0.08 mol/22.4 liter, and that in the glass was found to be about 0.01 wt. %. Thus, at a temperature exceeding 633° C., the aluminum concentration in the atmosphere became 0.5 mol/22.4 liter, and that of the glass thus obtained was found to be halved.

Measurements were made on the same items as those in Example 1, and the results are given in Table 3. It has been confirmed from the results in Table 3 that the product yields excellent resistance against plasma corrosion.

Example 11

A silica glass preform 500 mm in diameter and 1,000 mm in length prepared by soot method was set inside an airtight high pressure vessel together with 500 mg of aluminum chloride granules, and, after replacing the atmosphere to gaseous $N_2$, the gas inlet line was stopped, and heating was initiated to elevate the temperature to 250° C., thereby gasifying all of aluminum chloride to obtain a high pressure atmosphere of 10 kg/cm$^2$, i.e., an atmosphere having a concentration of 9 mol/22.4 liter. The state was maintained for 10 hours, at which time heating was stopped to lower the temperature to room temperature and the soot was taken out of the vessel.

The soot taken out of the vessel was placed inside a vacuum furnace to elevate the temperature to 1,800° C. to obtain a transparent glass body. From the surface portion of the thus obtained quartz glass, 6 wt. % of aluminum was detected, but for a portion at a depth of 5 mm from the surface, the aluminum concentration was found to be 3.0 wt. %. Thus formed quartz glass was found to have an average aluminum concentration of ca. 4.0 wt. %. The gaseous aluminum chloride concentration of the atmosphere, the aluminum concentration of the glass, and the aluminum concentration of the resulting glass were about the same as those obtained in Example 10.

Furthermore, measurements were performed for the same items as those in Example 1, and the results are given in Table 3. It has been confirmed from the results in Table 3 that the product yields excellent resistance against plasma corrosion.

Example 12

A quartz glass ingot was prepared in the same manner as in Example 10, except for using zirconium chloride granules as the doping material in the place of aluminum chloride granules, and for gasifying all of zirconium chloride by elevating the temperature to 500° C. The zirconium concentration of the thus obtained quartz glass ingot was measured, and measurements were performed for the same items as those in Example 1. The results are given in Table 3. It has been confirmed from the results in Table 3 that the product yields excellent resistance against plasma corrosion.

TABLE 3

| | Example No. | | | |
|---|---|---|---|---|
| | 9 | 10 | 11 | 12 |
| Production method | Verneuil | CVD | CVD | CVD |
| Metallic element compound | Ethyl silicate + Al isopropoxide | $AlCl_3$ | $AlCl_3$ | $ZrCl_4$ |
| State of sample before etching test | | | | |
| Bubbles mm$^2$ | 18 | 20 | 18 | 31 |
| Crystalline phase mm$^2$ | 12 | 40 | 23 | 24 |
| XRD*[1] | None | None | None | None |
| Foreign matters | | | | |
| Concentration of metallic element (wt. %) | 1.2 | 1.1 | 4.0 | 1.8 |
| Particles generated (particles) | 10 | 16 | 8 | 15 |
| Etching rate (nm/min) | 40 | 44 | 22 | 34 |

Example 13

Slurry was prepared by mixing 750 g of quartz powder consisting of particles 500 to 100 μm in particle diameter, 200 g of pyrolytic silica particles 0.01 to 4 μm in particle diameter, 700 g of aluminum nitrate, and 1,500 g of pure water. The slurry was dried for 8 days in air at 40° C. to obtain a solid, and the resulting solid was subjected to a heat treatment at 1,800° C. for 1 hour in vacuum to prepare transparent glass 100 mm in diameter and 50 mm in height. The aluminum concentration for the whole bulk was found to be 2.0 wt. %.

Measurements were made on the same items as those in Example 1, and the results are given in Table 4. It has been confirmed from the results in Table 4 that the product yields excellent resistance against plasma corrosion.

Example 14

Quartz glass ingot was prepared in the same manner as in Example 13, except for using zirconium oxynitrate as the doping material in the place of aluminum nitrate. Measurements were performed on the resulting quartz glass ingot for the zirconium concentration and the same items as those measured in Example 1. The results are given in Table 4. It has been confirmed from the results in Table 4 that the product yields excellent resistance against plasma corrosion.

Example 15

Quartz glass ingot was prepared in the same manner as in Example 13, except for using yttrium nitrate as the doping material in the place of aluminum nitrate. Measurements were performed on the resulting quartz glass ingot for the yttrium concentration and the same items as those measured in Example 1. The results are given in Table 4. It has been confirmed from the results in Table 4 that the product yields excellent resistance against plasma corrosion.

Example 16

Quartz glass ingot was prepared in the same manner as in Example 13, except for using samarium nitrate as the doping material in the place of aluminum nitrate. Measurements were performed on the resulting quartz glass ingot for the samarium concentration and the same items as those measured in Example 1. The results are given in Table 4. It has been confirmed from the results in Table 4 that the product yields excellent resistance against plasma corrosion.

TABLE 4

| | Example No. | | | |
|---|---|---|---|---|
| | 13 | 14 | 15 | 16 |
| Production method | Slip | Slip | Slip | Slip |
| Metallic element compound | Pure water + aluminum nitrate | Pure water + zirconium oxynitrate | Pure water + yttrium nitrate | Pure water + samarium nitrate |
| State of sample before etching test | | | | |
| Bubbles ($mm^2$) | 18 | 25 | 24 | 19 |
| Foreign matters ($mm^2$) | 25 | 20 | 20 | 22 |
| XRD*1 Foreign matters | None | None | None | None |
| Concentration of metallic element (wt. %) | 2.1 | 2.2 | 1.9 | 2.1 |
| Particles generated (particles) | 20 | 12 | 11 | 10 |
| Etching rate (nm/min) | 29 | 43 | 25 | 28 |

Example 17

Quartz glass ingot was prepared in the same manner as in Example 13, except for using 700 g of aluminum chloride and 1,500 g of ethanol as the doping material in the place of 700 g of aluminum nitrate and 1,500 g of pure water. Measurements were performed on the resulting quartz glass ingot for the aluminum concentration and the same items as those measured in Example 1. The results are given in Table 5. It has been confirmed from the results in Table 5 that the product yields excellent resistance against plasma corrosion.

Example 18

Quartz glass ingot was prepared in the same manner as in Example 13, except for using a solution obtained by dissolving aluminum in hydrochloric acid at a concentration of 5 wt. % as the doping material in the place of 700 g of aluminum nitrate and 1,500 g of pure water. Measurements were performed on the resulting quartz glass ingot for the aluminum concentration and the same items as those measured in Example 1. The results are given in Table 5. It has been confirmed from the results in Table 5 that the product yields excellent resistance against plasma corrosion.

Example 19

Quartz glass ingot was prepared in the same manner as in Example 13, except for using a solution obtained by dissolving Al isopropoxide in propanol at a concentration of 30 wt. % as the doping material in the place of 700 g of aluminum nitrate and 1,500 g of pure water. Measurements were performed on the resulting quartz glass ingot for the aluminum concentration and the same items as those measured in Example 1. The results are given in Table 5. It has been confirmed from the results in Table 5 that the product yields excellent resistance against plasma corrosion.

Example 20

Quartz glass was prepared in the same manner as in Example 13, except for using a solution obtained by dissolving Al isopropoxide in ethyl silicate at a concentration of 30% by weight as the doping material in the place of 700 g of aluminum nitrate and 1,500 g of pure water. Measurements were performed on the resulting quartz glass ingot for the aluminum concentration and the same items as those measured in Example 1. The results are given in Table 5. It has been confirmed from the results in Table 5 that the product yields excellent resistance against plasma corrosion.

TABLE 5

| | Example No. | | | |
|---|---|---|---|---|
| | 17 | 18 | 19 | 20 |
| Production method | Slip | Slip | Slip | Slip |
| Metallic element compound | Ethanol + $AlCl_3$ | Hydrochloric acid + aluminum | Propanol + Al iso-propoxide | Ethyl silicate + Al iso-propoxide |
| State of sample before etching test | | | | |
| Bubbles ($mm^2$) | 20 | 19 | 19 | 20 |
| Foreign matters ($mm^2$) | 23 | 17 | 20 | 13 |
| XRD*1 Foreign matters | None | None | None | None |
| Concentration of metallic element (wt. %) | 2.1 | 2.3 | 1.9 | 1.8 |
| Particles generated (particles) | 19 | 17 | 10 | 10 |
| Etching rate (nm/min) | 39 | 43 | 35 | 45 |

Example 21

A solution prepared by dissolving aluminum isopropoxide in propanol was dropped on the surface of a quartz glass jig 200 mm in diameter and 20 mm in thickness, and an alumina film was formed thereon by hydrolyzing the solution together with water in air. The plane of the quartz glass plate having the film formed thereon was fire polished and baked by using an oxyhydrogen flame to thereby obtain a smooth transparent fused plane. The average aluminum concentration to a depth of 0.1 mm from the surface portion was found to be 15 wt. %, but the average aluminum concentration to a depth of 1 mm was found to be 0.5 wt. %. The average aluminum concentration of the thus formed quartz glass jig was about 2.1 wt. %.

Measurements were performed for the same items as those of Example 1, and the results are given in Table 6. It has been confirmed from the results in Table 6 that the product yields excellent resistance against plasma corrosion.

Example 22

Quartz glass ingot was prepared in the same manner as in Example 21, except for using a solution prepared by dissolving aluminum isopropoxide in ethyl silicate in the place of the solution prepared by dissolving aluminum isopropoxide in propanol. Measurements were performed on the resulting quartz glass ingot for the aluminum concentration and the same items as those measured in Example 1. The results are given in Table 6. It has been confirmed from the results in Table 6 that the product yields excellent resistance against plasma corrosion.

Example 23

Quartz glass ingot was prepared in the same manner as in Example 21, except for using a solution prepared by dissolving zirconium isopropoxide in propanol in the place of the solution prepared by dissolving aluminum isopropoxide in propanol. Measurements were performed on the resulting quartz glass ingot for the zirconium concentration and the same items as those measured in Example 1. The results are given in Table 6. It has been confirmed from the results in Table 6 that the product yields excellent resistance against plasma corrosion.

Example 24

Quartz glass ingot was prepared in the same manner as in Example 21, except for using a solution prepared by dissolving titanium isopropoxide in propanol in the place of the solution prepared by dissolving aluminum isopropoxide in propanol. Measurements were performed on the resulting quartz glass ingot for the titanium concentration and the same items as those measured in Example 1. The results are given in Table 6. It has been confirmed from the results in Table 6 that the product yields excellent resistance against plasma corrosion.

TABLE 6

| | Example No. | | | |
|---|---|---|---|---|
| | 21 | 22 | 23 | 24 |
| Production method | Coating | Coating | Coating | Coating |
| Metallic element compound | Propanol + Al iso-propoxide propoxide | Ethyl silicate + Al iso- | Propanol + Zr iso-propoxide | Propanol + Ti iso-propoxide |
| State of sample before etching test | | | | |
| Bubbles ($mm^2$) | 24 | 15 | 18 | 19 |
| Crystalline phase ($mm^2$) | 24 | 28 | 22 | 18 |
| XRD*1 | None | None | None | None |
| Foreign matters | | | | |
| Concentration of metallic element (wt. %) | 2.1 | 2.4 | 1.4 | 1.5 |
| Particles generated (particles) | 13 | 8 | 13 | 15 |
| Etching rate (nm/min) | 43 | 32 | 50 | 32 |

Example 25

Quartz glass ingot was prepared in the same manner as in Example 21, except for using a solution prepared by dissolving aluminum nitrate in pure water in the place of the solution prepared by dissolving aluminum isopropoxide in propanol. Measurements were performed on the resulting quartz glass ingot for the aluminum concentration and the same items as those measured in Example 1. The results are given in Table 7. It has been confirmed from the results in Table 7 that the product yields excellent resistance against plasma corrosion.

Example 26

Quartz glass ingot was prepared in the same manner as in Example 25, except for using a solution prepared by dissolving aluminum chloride in ethanol at a concentration of 30 wt. % in the place of the solution prepared by dissolving aluminum isopropoxide in propanol. Measurements were performed on the resulting quartz glass ingot for the aluminum concentration and the same items as those measured in Example 1. The results are given in Table 7. It has been confirmed from the results in Table 7 that the product yields excellent resistance against plasma corrosion.

Example 27

Quartz glass ingot was prepared in the same manner as in Example 25, except for using a solution prepared by dissolving aluminum in hydrochloric acid at a concentration of 5 wt. % in the place of the solution prepared by dissolving aluminum isopropoxide in propanol. Measurements were performed on the resulting quartz glass ingot for the aluminum concentration and the same items as those measured in Example 1. The results are given in Table 7. It has been confirmed from the results in Table 7 that the product yields excellent resistance against plasma corrosion.

Example 28

A disk jig 200 mm in diameter and 25 mm in thickness was prepared by working the quartz glass body produced in Example 1. A layer containing aluminum distributed at a high concentration was formed on the surface of the jig by the method described in Example 21. The average aluminum concentration of the surface to a depth of 0.1 mm was found to be 15 wt. %, but the average aluminum concentration to a depth of 1 mm was found to be 4.0 wt. %. The average aluminum concentration of the resulting quartz glass jig was found to be was found to be approximately 4.0 wt. %. Measurements were performed on the resulting quartz glass ingot for the same items as those measured in Example 1. The results are given in Table 7. It has been confirmed from the results in Table 7 that the product yields excellent resistance against plasma corrosion.

TABLE 7

| | Example No. | | | |
|---|---|---|---|---|
| | 25 | 26 | 27 | 28 |
| Production method | Coating | Coating | Coating | Verneuil + Coating |
| Metallic element compound | Pure water + aluminum nitrate | Ethanol + $AlCl_3$ | Hydrochloric acid + Al | $Al_2O_3$ 5% propanol + Al iso-propoxide |
| State of sample before etching test | | | | |
| Bubbles ($mm^2$) | 19 | 19 | 24 | 16 |
| Foreign matters ($mm^2$) | 24 | 18 | 17 | 29 |
| XRD*1 | None | None | None | None |
| Foreign matters Concentration of metallic element (wt. %) | 2.0 | 2.1 | 2.2 | 4.0 |
| Particles generated (particles) | 13 | 16 | 17 | 7 |
| Etching rate (nm/min) | 43 | 34 | 39 | 17 |

Comparative Example 1

A 1,000-g portion of quartz powder consisting of particles 500 μm to 100 μm in particle diameter was filled in a carbon casting mold, and was subjected to a heat treatment at 1,800° C. for a duration of 1 hour in vacuum to obtain a transparent glass 100 mm in diameter and 50 mm in height. Measurements were performed on the resulting quartz glass ingot for the same items as those measured in Example 1. The results are given in Table 8. It has been found from the results in Table 8 that the etching rate is extremely high, and that the resistance against plasma corrosion of the product is poor.

Comparative Example 2

A 900-g portion of quartz powder consisting of particles 500 μm to 100 μm in particle diameter mixed with 100 g of alumina was filled in a carbon casting mold, and was subjected to a heat treatment at 1,800° C. for a duration of 1 hour in vacuum to obtain a transparent glass 100 mm in diameter and 50 mm in height. The aluminum concentration of the product was found to be 2.0 wt %. Bubbles and crystalline phase were found to be present in the glass body.

Measurements were performed on the resulting quartz glass ingot for the same items as those measured in Example 1. The results are given in Table 8. Table 8 clearly reads that the product not only contains bubbles and crystalline phase at high quantity, but also generates particles at a large quantity, and that the product is found unfeasible for use as a jig for silicon wafers. Furthermore, the etching rate is found to be extremely high, and the resistance against plasma corrosion of the product is found to be poor.

Comparative Example 3

A 690-g portion of quartz particles was mixed with 310 g of $Al_2O_3$ powder, and the resulting mixture was dropped and fused in an oxyhydrogen flame at a rate of 50 g/min on a target ingot being rotated at a speed of 1 rpm to obtain a quartz glass ingot 200 mm in diameter and 500 liter in volume. The gas condition was set to flow gaseous $H_2$ at a rate of 200 liter/min and gaseous $O_2$ at a rate of 100 liter/min. The target ingot was then set inside a volume 300 mm×300 mm×200 mm high. The gas flow rate for each of the gases was doubled because bubbles and crystalline phase generated at a large amount, but no improvement was observed, and further increase in gas flow rate led to the destruction of the ingot shape.

On measuring the aluminum concentration of the thus formed ingot by means of fluorescent X ray analysis, the aluminum concentration at the outermost surface portion was found to be 15.0 wt. %, and that for a portion at a depth of 5 mm was found to be 13.0 wt. % . Since gasification of quartz proceeds at the outermost surface, it is presumed that the concentration tends to become higher at the surface.

Measurements were performed for the same items as those measured in Example 1, and the results are given in Table 8. Table 8 clearly reads that, although the etching rate is low, the product not only contains bubbles and crystalline phase at high quantities, but also generates particles at a large quantity, and that the product is unfeasible for use as a jig for silicon wafers.

TABLE 8

| | Example No. | | |
|---|---|---|---|
| | 1 | 2 | 3 |
| Production method | Vacuum furnace | Vacuum furnace | Verneuil |
| Metallic element compound | None | $Al_2O_3$ 5 wt. % | $Al_2O_3$ 31 wt. % |
| State of sample before etching test | | | |
| Bubbles ($mm^2$) | 20 | 280 | 449 |
| Crystalline phase ($mm^2$) | 14 | 538 | 894 |
| XRD*1 | None | Present | Present |
| Foreign matters Concentration of metallic element (wt. %) | 0.0 | 2.0 | 13.0 |
| Particles generated (particles) | 20 | 300 | 800 |
| Etching rate (nm/min) | 120 | 64 | 43 |

The content of bubbles and crystalline phase in Examples and Comparative Examples above was measured in the following manner. Samples 50 mm×50 mm×1 mm (thickness) in size were each cut out from the quartz glass bodies, and the both surface planes were mirror polished. Then, white light was allowed to pass from the lower plane of the sample, and the projected images of the bubbles and crystalline phase were subjected to image analyzer to count up the quantity of bubbles and crystalline phase having a diameter of 0.02 mm or larger. From the thus obtained results, the area (projected area) of the bubbles and crystalline phase present in the whole area of the sample were calculated to obtain the cross section area (projected area) per 100 $cm^3$.

The etching rate was measured in the following manner. From the prepared transparent quartz glass, a sample was cut out and worked to a piece 30 mm in diameter and 3 mm in thickness, and the surface thereof was fire polished. The sample piece was then subjected to an etching test using a plasma gas containing $CF_4$ and $O_2$ (20%) flowing at a rate of 50 sccm under a pressure of 30 mTorr, a power of 1 kW, and for duration of 10 hours. From the weights obtained before and after the test, the change in thickness was calculated, and the calculated result was further divided by the process time to calculate the etching rate.

The quantity of generated particles was obtained by mounting a Si wafer having the same area as that of the sample on the plasma-irradiated surface of the sample after etching, and the irregularities on the contact plane of the wafer ware detected by laser scattering. Thus, particles 0.3 μm or larger in size were counted up by using a particle counter.

In the Examples 1 to 28 and Comparative Examples 1 to 3, it was found that the usable portion of the Si wafer was 90% or higher in case the quantity of generated particles was 50 counts or less, but the yield was greatly reduced to 50% or lower in case the quantity of generated particles exceeded 200 counts. In case the etching rate was 100 nm/min or higher, the etching thickness resulted in 0.6 mm or more for a use of about 100 hours, thereby making it unfeasible as a member; but with an etching rate of 50 nm/min or lower, the usable duration was doubled to confirm the effect. In particular, an etching rate of 20 nm/min or lower resulted to provide a considerably high economical effect.

Example 29

A 28,500-g portion of quartz particles consisting of particles from 100 to 500 μm in particle diameter was mixed with 1,500 g of $Al_2O_3$ powder, and the resulting mixture was dropped and fused in an oxyhydrogen flame at a rate of 50 g/min on a target ingot being rotated at a speed of 1 rpm to obtain a quartz glass ingot of 200 mm in diameter and 400 mm in length. The gas condition was set as such to flow gaseous $H_2$ at a rate of 300 liter/min and gaseous $O_2$ at a rate of 100 liter/min.

The ingot thus prepared was then set inside a heating furnace, and was kept at 1,800° C. for a duration of 2 hours under gaseous $N_2$ atmosphere at a pressure of 1 kg/$cm^2$ to obtain a shaped body of 400 mm in diameter and 100 mm in length. A quartz glass disk of 350 mm in diameter and 20 mm in thickness was cut out from the thus obtained quartz glass shaped body, and the upper and the bottom planes were subjected to a cutting. The surface Ra value was found to be 2.0 μm, and the quartz glass disk was found to contain OH at a concentration of 300 wt. ppm.

Further, qualitative and quantitative analysis of the generated gas was performed in the temperature range of from room temperature to 1,000° C. on the sample cut out from the same quartz glass shaped body obtained above. As a result, it was found that gaseous CO, $H_2O$, $O_2$, and $H_2$ were generated in total amount of 0.4 mol/$m^3$. The bubbles and foreign matters inside the quartz glass disk amounted to 10 $mm^2$ per 100 $cm^3$, and the internal transmittance of the visible radiation was found to be 85%/cm.

The Al concentration as obtained by means of fluorescent X-ray analysis was 3.0 wt. %. A sample of 30 mm in diameter and 3 mm in thickness was cut out, and the surface thereof was subjected to cutting to result in a surface roughness Ra of 2.0 μm. Then, an etching test was performed on the resulting sample in gaseous plasma of $CF_4$ and $O_2$ (accounting for 20%) flowing at a rate of 50 sccm, under a pressure of 30 mTorr and a power of 1 kW for time duration of 10 hours. The etching rate was calculated from the change of mass before and after the test to obtain a result of 30 nm/min.

The quantity of generated particles was obtained by mounting a Si wafer having the same area as that of the sample on the plasma-irradiated surface of the sample after etching, and the irregularities on the contact plane of the wafer were detected by laser scattering. Thus, particles 0.3 μm or larger in size were counted up by using a particle counter to obtain 10 counts as a result.

Example 30

Slurry was prepared by mixing 22,500 g of quartz particles from 100 to 500 μm in particle diameter with 6,000 g of pyrolytic silica particles from 0.01 μm to 4 μm in particle diameter, 2,100 g of aluminum nitrate, and 4,500 g of pure water. The slurry was dried for 8 days in air at 40° C., and, after holding the dried slurry in air at 500° C. for 4 hours, heating treatment was applied thereto in vacuum at 1,800° C. for 1 hour to obtain a transparent quartz glass body of 380 mm in diameter and 25 mm in length. A quartz glass disk of 350 mm in diameter and 20 mm in thickness was cut out from the thus obtained quartz glass body, and the upper and bottom planes were subjected to cutting. The surface Ra value was found to be 3.0 μm, and the quartz glass disk was found to contain OH at a concentration of 300 ppm. The Al concentration of the sample cut out in the same manner as above was measured by means of fluorescent X-ray analysis to be 3.0 wt % as a result. The other results were found to be the same as those obtained in Example 29.

Example 31

An aqueous aluminum nitrate solution was applied to the surface of the quartz glass jig of 350 mm in diameter and 20 mm in thickness, and the resulting coated plane was melted by means of oxyhydrogen flame to form a smooth transparent fused surface. The surface Ra value of the thus obtained quartz glass jig was found to be 0.2 μm, and the OH concentration was found to be 300 ppm. The Al concentration of the fused plane of the quartz glass jig was measured by means of fluorescent X-ray analysis to find 5.0 wt. % as a result. The other results were found to be the same as those obtained in Example 29.

Comparative Example 4

A 30,000-g portion of quartz particles consisting of particles from 100 to 500 μm in particle diameter was mixed, charged in a carbon casting mold, and subjected to a heat treatment at 1,800° C. for a time duration of 1 hour in vacuum to obtain a transparent quartz glass body of 400 mm in diameter and 100 mm in length. The Al concentration of the sample cut out from the resulting glass body was measured by means of fluorescent X-ray analysis to find 0.0 wt. % as a result. Furthermore, a sample was prepared and plasma etching test was performed in a manner similar to that described in Example 29. The etching rate was found to be 120 nm/min. The other evaluation results were the same as those described in Example 29.

Comparative Example 5

A 27,000-g portion of quartz particles consisting of particles from 100 to 500 μm in particle diameter was mixed with 300 g of A1203 powder, and the resulting mixture was charged in a carbon casting mold for a heat treatment at 1,800° C. for a time duration of 1 hour in vacuum to obtain a transparent quartz glass body of 400 mm in diameter and 100 mm in length. Numerous bubbles and foreign matters were observed to be present inside the transparent quartz glass body to yield a projected area per 100 $cm^3$ of 300 $mm^2$. The internal transmittance for a visible radiation was found to be 15%/cm. The Al concentration of the sample cut out from the resulting glass body was measured by means of fluorescent X-ray analysis to be 5.0 wt % as a result. Furthermore, a sample was prepared in the same manner as in Example 29, and evaluations similar to those in Example 29 were performed thereon to obtain an etching rate of 64 nm/min and a particle generation amounting to 300 counts.

Comparative Example 6

A 17,000-g portion of quartz particles consisting of particles from 100 to 500 μm in particle diameter was mixed with 1,300 g of $Al_2O_3$ powder, and a transparent quartz glass body was prepared in the same manner as in Example 29. Numerous bubbles and foreign matters were observed to be present inside the transparent quartz glass body to yield a projected area per 100 $cm^3$ of 300 $mm^2$. The internal transmittance for a visible radiation was found to be 15%/cm. The Al concentration of the sample cut out from the resulting glass body was measured by means of fluorescent X-ray analysis to be 21 wt % as a result. Furthermore, a sample was prepared in the same manner as in Example 29, and evaluations similar to those in Example 29 were performed thereon to obtain an etching rate of 40 nm/min and a particle generation amounting to 800 counts.

In the Examples 29 to 31 and the Comparative Examples 4 to 6 above, the usable portion of a Si wafer with particle generation of 50 counts or less accounted for 90% or more, but the yield was lowered to 50% or less in case the particle generation exceeded 200 counts. Further, in case the etching rate was 120 nm/min or higher, the etching proceeded to a depth of 1.0 mm after using for about 100 hours, and the quartz glass body was found unfeasible for a member. However, the effect of the invention was confirmed as the etching rate decreased to 50 nm/min or lower because the usable life was doubled. In particular, a great economical effect was obtained as the etching rate decreased to 20 nm/min or lower.

What is claimed is:

1. An article comprising a body made of quartz glass having improved corrosion resistance against plasma, the quartz glass containing bubbles and crystalline phase at a quantity accounting for less than 100 $mm^2$ in a projection area per 100 [$cm_3$] *$cm^3$* of the quartz glass body, and said quartz glass body having a metallic element containing surface layer having a thickness of at least 5 mm containing 0.1 to 20% by weight of a metallic element, wherein the metallic element is selected from the group consisting of Sm, Y, Zr and Ti.

2. An article as claimed in claim 1, wherein the metallic element has a boiling point higher than that of a Si fluoride.

3. An article as claimed in claim 1, wherein the metallic element is able to react with fluorine to form a fluoride compound and the fluoride compound of said metallic element [having] *has* a boiling point that is higher than that of the fluoride compound of Si ($SiF_4$).

4. An article as claimed in claim 1, wherein the metallic element containing surface layer further comprises a second element selected from the group consisting of Sm, Eu, Yb, Pm, Pr, Nd, Ce, Tb, Gd, [Ba] *Ba,* Mg, Y, [Tin] *Tm*, Dy, Ho, Er, Cd, Co, Cr, Cs, Zr, Al, In, Cu, Fe, Bi, Ga and Ti.

5. An article as claimed in claim 1, wherein the metallic element is additionally applied to a surface thereof.

6. An article as claimed in claim 1, said quartz glass body having a surface roughness Ra of 0.01 to 10 μm.

7. An article as claimed in claim 6, wherein said body has a surface that is brought into contact with a plasma corrosive gas, said surface being obtained by subjecting the surface to a precision cutting treatment, or a heating and melting treatment.

8. An article as claimed in claim 1, wherein the quartz glass has an OH concentration of 100 to 2000 ppm.

9. An article as claimed in claim 1, wherein 2 mol/$m^3$ or less of a gas is discharged from the article when it heated in a temperature range of from room temperature to 1000° C.

10. An article as claimed in claim 1, wherein the quartz glass has an internal transmittance for a visible radiation of 50%/cm or higher.

11. An article as claimed in claim 1, wherein the body is configured to function as a jig for supporting wafers.

12. An article as claimed in claim 7, wherein said surface is subjected to said heating and melting treatment followed by a chemical etching treatment.

*13. An article comprising a body made of quartz glass having improved corrosion resistance against plasma, the quartz glass being doped with a metallic element, the quartz glass containing bubbles and crystalline phase at a quantity accounting for less than 100 $mm^2$ in a projection area per 100 $cm^3$ of the quartz glass body, wherein the quartz glass body has a metallic element-containing layer with a predetermined thickness containing 0.1 to 20% by weight of said metallic element.*

*14. An article as claimed in claim 13, wherein the metallic element has a boiling point higher than that of a Si fluoride.*

*15. An article as claimed in claim 13, wherein the metallic element is able to react with fluorine to form a fluoride compound and the fluoride of said metallic element has a boiling point that is higher than that of the fluoride compound of Si.*

*16. An article as claimed in claim 13, wherein the metallic element is one or more elements selected from the group consisting of rare earth elements, Ba, Mg, Cd, Co, Cr, Cs, Zr, In, Cu, Fe, Bi, Ga and Ti.*

*17. An article as claimed in claim 16, wherein the quartz glass is further doped with Al.*

*18. An article as claimed in claim 13, wherein said metallic element is present in a concentration in a range from 0.1 to 20% by weight.*

*19. An article as claimed in claim 13, wherein said metallic element-containing layer is a surface layer having a thickness of at least 5 mm.*

*20. An article as claimed in claim 18, wherein the metallic element is additionally applied to the surface thereof.*

*21. An article as claimed in claim 13, said quartz glass body having a surface roughness Ra of 0.01 to 10 μm.*

*22. An article as claimed in claim 13, wherein said body has a surface that is brought into contact with a plasma corrosive gas, said surface being obtained by subjecting the surface to a precision cutting treatment, a heating and melting treatment, or a heating and melting treatment followed by a chemical etching treatment.*

*23. An article as claimed in claim 13, wherein the quartz glass has an OH concentration of 100 to 2000 ppm.*

*24. An article as claimed in claim 13, wherein 2 mol/m$^3$ or less of a gas are generated in a temperature range of from room temperature to 1000° C.*

*25. An article as claimed in claim 13, wherein the quartz glass has an internal transmittance for a visible radiation of 50%/cm or higher.*

*26. An article as claimed in claim 13, wherein said body has said metallic element applied to a surface thereof.*

*27. An article as claimed in claim 13, wherein the body is configured to function as a jig for supporting wafers.*

* * * * *